(12) United States Patent
Aitken et al.

(10) Patent No.: US 7,734,974 B2
(45) Date of Patent: Jun. 8, 2010

(54) SERIAL SCAN CHAIN CONTROL WITHIN AN INTEGRATED CIRCUIT

(75) Inventors: Robert Campbell Aitken, San Jose, CA (US); Dipesh Ishwerbhai Patel, Saratoga, CA (US); Gary Robert Waggoner, San Jose, CA (US)

(73) Assignee: ARM Limited, Cambridge (GB)

( * ) Notice: Subject to any disclaimer, the term of this patent is extended or adjusted under 35 U.S.C. 154(b) by 393 days.

(21) Appl. No.: 11/826,025

(22) Filed: Jul. 11, 2007

(65) Prior Publication Data

US 2009/0019329 A1 Jan. 15, 2009

(51) Int. Cl.
*G01R 31/28* (2006.01)

(52) U.S. Cl. ....................................... 714/729
(58) Field of Classification Search ................... 714/727, 714/729
See application file for complete search history.

(56) References Cited

U.S. PATENT DOCUMENTS

| | | | | |
|---|---|---|---|---|
| 5,423,050 A | * | 6/1995 | Taylor et al. | 714/31 |
| 5,428,624 A | * | 6/1995 | Blair et al. | 714/727 |
| 5,459,737 A | * | 10/1995 | Andrews | 714/733 |
| 7,165,006 B2 | * | 1/2007 | Dhong et al. | 702/120 |
| 7,580,807 B2 | * | 8/2009 | Bullock et al. | 702/117 |
| 2005/0010832 A1 | * | 1/2005 | Caswell et al. | 713/330 |

OTHER PUBLICATIONS

Aerts et al., "Scan Chain Design for Test Time Reduction in Core-Based ICS", IEEE International Test Conference, pp. 448-457 (1998).

* cited by examiner

*Primary Examiner*—James C Kerveros
(74) *Attorney, Agent, or Firm*—Nixon & Vanderhye P.C.

(57) ABSTRACT

An integrated circuit 2 includes a plurality of circuit blocks 38, 40, 44 each having an associated serial scan chain loop 32, 34, 36 which extends from a converter 10, to the circuit block 38, 42, 44 in question and then back to the converter 10. Multiplexing circuitry 50, 52 associated with each serial scan chain loop 32, 34, 36 is used to either include that serial scan chain loop 32, 34, 36 in a combined serial scan chain or to bypass that serial scan chain loop 32, 34, 36. The circuit blocks 38, 42, 44 may be bypassed in this way if they are defective or if they are powered-down.

13 Claims, 2 Drawing Sheets

SERIAL SCAN CHAIN CONTROL WITHIN AN INTEGRATED CIRCUIT

BACKGROUND OF THE INVENTION

1. Field of the Invention

This invention relates to the field of integrated circuits. More particularly, this invention relates to the control of serial scan chains used for test operations within integrated circuits.

2. Description of the Prior Art

As integrated circuits become increasingly complex, there is an increase in need the for effective test mechanisms which can be used to debug the design or programming of those integrated circuits as well as to check that they have been correctly manufactured. Serial scan chain techniques in accordance with the known IEEE 1149.1 JTAG Standard and the IEEE 1500 Standard for Embedded Core Test provide effective and well understood mechanisms for performing test operations. There exists a considerable infrastructure of tools and knowledge for using these techniques to perform test operations upon integrated circuits. Accordingly, it is advantageous to keep using these techniques where possible so that the existing capital associated therewith can be reused.

As part of the increasing complexity of integrated circuits, it is becoming common that manufacturing failures occur within part of an integrated circuit, but that that integrated circuit still has value and is useable if the other parts of that integrated circuit still function correctly. As an example, in a memory integrated circuit, it may be that one or more of the banks of memory are defective, such as due to a manufacturing defect, but that the integrated circuit as a whole will still have other functioning memory banks and can be usefully used as a lower memory capacity integrated circuit.

Another example of the increasing complexity of integrated circuits is that different circuit blocks therein may be selectively powered-down and powered-up during normal operation in order to reduce the average power consumption of the integrated circuit. It is desirable to be able to perform test operations on an integrated circuit when parts of that integrated circuit are powered-down in order to properly understand the behaviour of the integrated circuit and identify any design or manufacturing problems therein.

The paper "Scan Chain Design For Test Time Reduction in Core-Based Ics" by Joep Aerts and Erik Jan Marinissen published in proceedings of the 1998 IEEE International Test Conference pages 448-457 discloses various scan chain architectures with a view to reducing test time. One of these architectures is a daisychain architecture in which a local bypass is provided for each of a plurality of cores within an integrated circuit. Control signals are routed to multiplexers associated with each local bypass proximal to the core concerned. This arrangement suffers from the problem that a defect with a core or scan chain has an increased likelihood of also effecting the multiplexer and bypass path rendering bypassing of the defect impossible. Furthermore, as areas within an integrated circuit are selectively powered down it is a disadvantageous complexity to maintain power to a local bypass and multiplexer.

SUMMARY OF THE INVENTION

Viewed from one aspect the present invention provides an integrated circuit comprising:
a plurality of circuit blocks;
a test controller responsive to test commands received from outside said integrated circuit to perform test operations upon said plurality of circuit blocks; and
a plurality of serial scan chain loops, each one of said plurality of serial scan chain loops extending from said test controller to a respective one of said plurality of circuit blocks to communicate test signals therewith and back to said test controller; wherein
said test controller comprises multiplexing circuitry coupled to said plurality of serial scan chain loops and responsive to configuration commands to link together selected serial scan chain loops of said plurality of serial scan chain loops to form a combined serial scan chain loop having an input connection and an output connection such that test signals can be serially scanned through said combined serial scan chain loop to provide communication of said test signals between a test device external of said integrated circuit and those of said plurality of circuit blocks corresponding to said selected serial scan chain loops.

It is known within the existing test mechanisms to provide serial scan chains extending throughout an integrated circuit and reaching all portions of the integrated circuit to give the ability to apply test signals to all portions of the integrated circuit and to recover test signals from those portions. However, such long serial scan chains pose some difficulties. The present technique recognises these difficulties and provides a solution thereto. More particularly, the present technique provides that a combined serial scan chain can be made by linking together several serial scan chain loops under control of a configuration command applied to the test controller. This allows the serial scan chain loops associated with some circuit blocks to be removed from the combined serial scan chain (e.g. which may be defective and not allow serial data to be scanned therethrough, or powered-down not allowing serial scan data to be scanned therethrough), while the remaining circuit blocks can be subject to test operations using the combined serial scan chain. Whilst it might appear contrary to the normal design prejudices in this field to have to loop the serial scan chain back to the test controller from each circuit block resulting in a physically longer set of scan chains, in practice it is the logical length in terms of the number of clock cycles need to scan data through the serial scan chain which is more important and the advantages of being able to bypass certain portions of the serial scan chain associated with particular circuit blocks more than compensate for the extra physical length.

One situation in which the present technique is particularly useful is when there is a defect associated with a serial scan chain loop (either in that loop itself, or in the circuit block associated with that loop, which prevents serial data being scanned through that loop). In this circumstance it is desirable to still test the remaining circuit blocks within the integrated circuit as the test mechanisms for these are properly functioning and the integrated circuit will have value even through one of the circuit blocks is untested/defective.

Another example situation in which the present technique is useful is when the integrated circuit includes a power controller responsive to power commands to selectively place one or more of the plurality of circuit blocks into a power saving state in which it cannot communicate test signals. In this circumstance, it is desired to perform test operations on the remaining portions of the integrated circuit in order that that the correct operation of those portions can be verified, and indeed the correct power-down and power-up operation verified. In order to achieve this, the present technique allows a circuit block placed in the power saving state to be excluded from the combined serial scan chain thereby permitting the remainder of the circuit blocks to be subject to test operations.

The circuit blocks which may be subject to test can take a wide variety of different forms. Examples include general purpose processor cores, digital signal processors, interconnect logic or other general logic. The present technique is however well suited to integrated circuits in which the circuit blocks include one or more memories.

The high densities associated with memories mean that test operations performed upon such memories are very important. Furthermore, if some of the memories are inoperative, then it is likely that the integrated circuit will still have some value as it often may be able to operate with a reduced memory capacity. Accordingly, it is important to be able to bypass defective areas of memory such that the other portions of the integrated circuit can be properly tested.

When communicating test signals with a group of one or more memories, a built-in test controller can be used to test that group of memories and the test signals applied thereto can include commands for the built-in test controller, test pattern data to be used by the built-in test controller and result data resulting from the tests performed by the built-in test controller.

Whilst it will be appreciated that the present technique is not restricted to any particular test standard, it is well suited to the long and comprehensive boundary-type serial scan chains associated with the IEEE Standard for embedded core test (IEEE 1500).

Viewed from another aspect the present invention provides an integrated circuit comprising:

a plurality of circuit block means;

test controller means responsive to test commands received from outside said integrated circuit for performing test operations upon said plurality of circuit block means; and a plurality of serial scan chain loop means, each one of said plurality of serial scan chain loop means extending from said test controller means to a respective one of said plurality of circuit block means to communicate test signals therewith and back to said test controller means; wherein said test controller means comprises multiplexing means coupled to said plurality of serial scan chain loops and responsive to configuration commands for linking together selected serial scan chain loop means of said plurality of serial scan chain loop means to form a combined serial scan chain loop means having an input connection and an output connection such that test signals can be serially scanned through said combined serial scan chain loop means to provide communication of said test signals between a test device external of said integrated circuit and those of said plurality of circuit block means corresponding to said selected serial scan chain loop means.

Viewed from a further aspect the present invention provides a method of testing an integrated circuit comprising a plurality of circuit blocks, a test controller responsive to test commands received from outside said integrated circuit to perform test operations upon said plurality of circuit blocks and a plurality of serial scan chain loops, each one of said plurality of serial scan chain loops extending from said test controller to a respective one of said plurality of circuit blocks to communicate test signals therewith and back to said test controller; said method comprising the steps of:

in response to a configuration command to said test controller, linking together selected serial scan chain loops of said plurality of serial scan chain loops to form a combined serial scan chain loop having an input connection and an output connection; and serially scanning test signals through said combined serial scan chain loop to provide communication of said test signals between a test device external of said integrated circuit and those of said plurality of circuit blocks corresponding to said selected serial scan chain loops.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
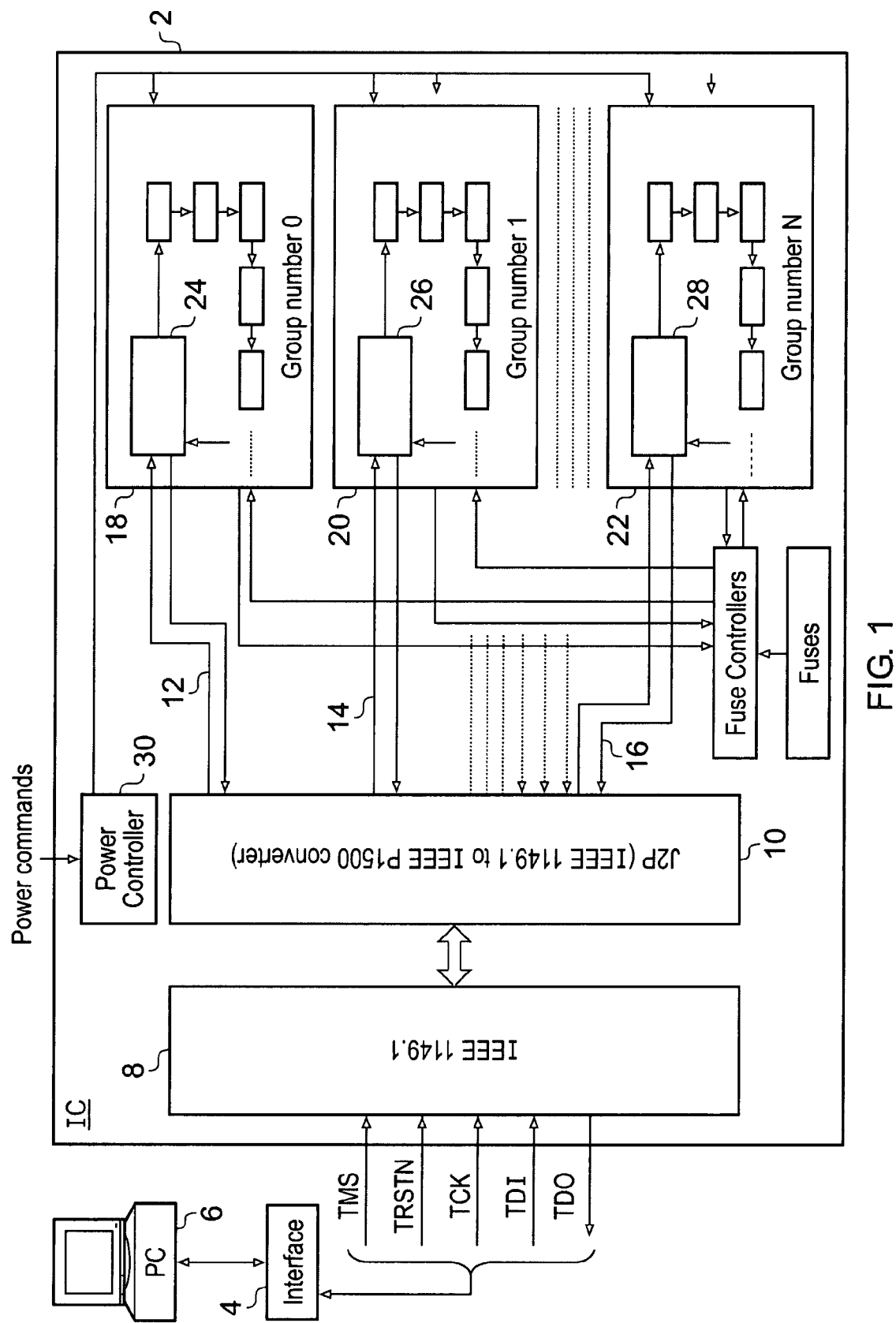
FIG. 1 schematically illustrates an integrated circuit including a plurality of circuit blocks having associated serial scan chain loops.

FIG. 1 illustrates an integrated circuit 2 connected to an external test device comprising an interface unit 4 and a general purpose computer 6. The interface 4 communicates via the IEEE 1149.1 Standard with the integrated circuit 2. An IEEE 1149.1 Test Access Port controller 8 within the integrated circuit receives these signals and passes them to a J2P converter 10 which converts the IEEE 1149.1 transferred signals into a form in accordance with the IEEE 1500 Standard for Embedded Core Test. This IEEE 1500 standard supports both the transfer of test signals representing signal values to be applied to or recovered from the circuit blocks under test and test commands used for configuring the test controller and conversion block 10 itself. These commands which can be used to configure the way in which the serial scan chain loops 12, 14, 16 are configured and combined to form a combined serial scan chain. More particularly, the different circuit blocks 18, 20, 22 each have associated with them a serial scan chain loop 12, 14, 16 which starts at the converter 40, extends to the relevant circuit block 18, 20, 22 and then passes back to the converter 10. The circuit blocks 18, 20, 22 in the illustration of FIG. 1 each comprise groups of memories which may be subject to test operations by a built-in test controller 24, 26, 28. The respective serial scan chain loops are used to pass test pattern data, built-in test controller commands and result data to and from the built-in test controllers 24, 26, 28.

The integrated circuit 2 also includes a power controller 30 which is responsive to power commands (in this example externally applied) to selectively power-up and power-down the groups of memories 18, 20, 22 which form the respective circuit blocks. When one of these circuit blocks 18, 20, 22 is powered-down it is not able to communicate test signals. In an analogous way, it may be that a defect within the associated serial scan chain loop 12, 14, 16 itself or the associated circuit block 18, 20, 22 prevents serial scan chain data being scanned through that particular loop 12, 14, 16. When either defective or powered-down it is appropriate that the relevant serial scan chain loop is excluded from the combined serial scan chain. This allows the combined serial scan chain to continue to operate to perform test operations, as well as advantageously speeding up such test operations by shortening the logical length of the combined serial scan chain.

The integrated circuit 2 may also include circuit blocks in the form of central processing unit cores, DSPs, general combinatorial logic etc, each having a serial scan chain loop associated therewith.

Figure 2:
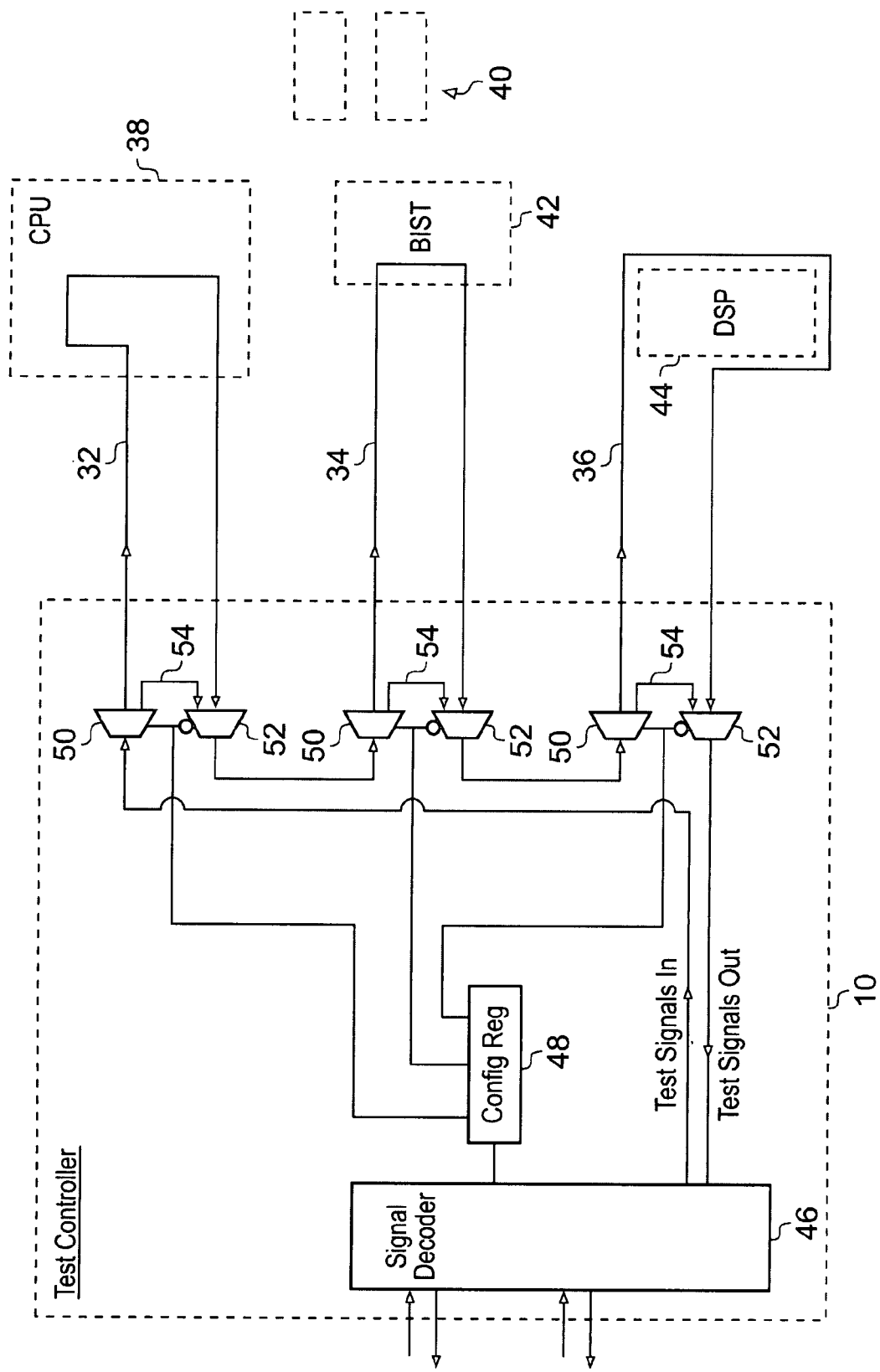
FIG. 2 is a diagram schematically illustrating a test controller including multiplexing circuitry for controlling a plurality of serial scan chain loops.

FIG. 2 illustrates certain aspects of the converter 10 in more detail in combination with three example serial scan chain loops 32, 34 and 36 which are respectively associated with a general purpose processor 38, a group of memories 40 with a built-in test controller 42 and a digital signal processor DSP 44.

Within the converter 10 there is a provided a signal decoder 46 which is responsive to test commands passed thereto to control the test operations being performed. One of these commands is a configuration command which is used to set a value within a configuration register 48. This is a multi-bit value with one bit corresponding to each of the serial scan loops 32, 34 and 36. If the corresponding bit is set, then the loop 32, 34, 36 concerned will be in use, whereas if the bit is not set then the loop 32, 34, 36 concerned will be bypassed. Multiplexers 50, 52 associated with each of the serial scan chain loops 32, 34 and 36 are responsive to the relevant bit from within the configuration register 48 to either use a bypass path 54 or to direct the test signals to pass through the relevant serial scan chain loop 32, 34, 36. As an example, it may be that the DSP 44 is powered-down and it is desired to exclude it from test operations as it is not capable of communicating test signals in this state. Accordingly, the multiplexers 50, 52 associated with the serial scan chain lop 36 will be set to bypass the serial scan chain loop 36 and the combined serial scan chain in use at that point will be composed of the serial scan chain loops 32 and 34. It will be understood by those in this technical field that reprogramming the value in the configuration register 48 adjusts the settings of the multiplexers 50, 52 so as to selectively place in use their associated serial scan chain loop 32, 34 and 36.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
   a plurality of circuit blocks;
   a test controller responsive to test commands received from outside said integrated circuit to perform test operations upon said plurality of circuit blocks;
   a plurality of serial scan chain loops, each one of said plurality of serial scan chain loops extending from said test controller to a respective one of said plurality of circuit blocks to communicate test signals therewith and back to said test controller, wherein said test controller comprises multiplexing circuitry coupled to said plurality of serial scan chain loops and responsive to configuration commands to link together selected serial scan chain loops of said plurality of serial scan chain loops to form a combined serial scan chain loop having an input connection and an output connection such that test signals can be serially scanned through said combined serial scan chain loop to provide communication of said test signals between a test device external of said integrated circuit and those of said plurality of circuit blocks corresponding to said selected serial scan chain loops; and
   a power controller coupled to at least some of said plurality of circuit blocks and responsive to power commands to selectively place one or more of said plurality of circuit blocks in a power saving state in which test signals cannot be communicated.

2. An integrated circuit as claimed in claim 1, wherein said multiplexing circuitry is configured by a configuration command to exclude an excluded serial scan chain loop from said combined serial scan chain when said excluded serial scan chain loop has an associated defect preventing test signals being scanned therethrough, said combined serial scan chain not including said excluded serial scan chain permitting test signals to be communicated with those of said plurality of circuit blocks corresponding to serial scan chain loops still included within said combined serial scan chain.

3. An integrated circuit as claimed in claim 1, wherein said multiplexing circuitry is configured by a configuration command to exclude an excluded serial scan chain loop from said combined serial scan chain when said excluded serial scan chain loop is associated with a circuit block in said power saving state, said combined serial scan chain not including said excluded serial scan chain permitting test signals to be communicated with those of said plurality of circuit blocks corresponding to serial scan chain loops still included within said combined serial scan chain.

4. An integrated circuit as claimed in claim 1, wherein at least one of said circuit blocks is a group of one or more memories including a built-in test controller.

5. An integrated circuit as claimed in claim 4, wherein said test signals communicated with said group of one or more memories via said combined serial scan chain comprise one or more of:
   built-in test controller commands for controlling said built-in test controller;
   test pattern input data to be used by said built-in test controller; and
   result data indicative of test results for test performed upon said group of one or more memories by said built-in test controller.

6. An integrated circuit as claimed in claim 1, wherein said test controller operates in accordance with the IEEE 1500 Standard for Embedded Core Test.

7. An integrated circuit comprising:
   a plurality of circuit block means;
   test controller means, responsive to test commands received from outside said integrated circuit, for performing test operations upon said plurality of circuit block means;
   a plurality of serial scan chain loop means, each one of said plurality of serial scan chain loop means extending from said test controller means to a respective one of said plurality of circuit block means to communicate test signals therewith and back to said test controller means, wherein said test controller means comprises multiplexing means coupled to said plurality of serial scan chain loops and responsive to configuration commands for linking together selected serial scan chain loop means of said plurality of serial scan chain loop means to form a combined serial scan chain loop means having an input connection and an output connection such that test signals can be serially scanned through said combined serial scan chain loop means to provide communication of said test signals between a test device external of said integrated circuit and those of said plurality of circuit block means corresponding to said selected serial scan chain loop means; and
   power control means, coupled to at least some of said plurality of circuit block means and responsive to power commands, for selectively placing one or more of said plurality of circuit blocks in a power saving state in which test signals cannot be communicated.

8. A method of testing an integrated circuit comprising a plurality of circuit blocks, a test controller responsive to test commands received from outside said integrated circuit to perform test operations upon said plurality of circuit blocks and a plurality of serial scan chain loops, each one of said plurality of serial scan chain loops extending from said test controller to a respective one of said plurality of circuit blocks to communicate test signals therewith and back to said test controller, said method comprising the steps of:

linking, in response to a configuration command to said test controller, together selected serial scan chain loops of said plurality of serial scan chain loops to form a combined serial scan chain loop having an input connection and an output connection; and serially scanning test signals through said combined serial scan chain loop to provide communication of said test signals between a test device external of said integrated circuit and those of said plurality of circuit blocks corresponding to said selected serial scan chain loops, wherein, in response to a power command, a power controller coupled to at least some of said plurality of circuit blocks selectively places one or more of said plurality of circuit blocks in a power saving state in which test signals cannot be communicated.

9. A method as claimed in claim 8, wherein said configuration command excludes an excluded serial scan chain loop from said combined serial scan chain when said excluded serial scan chain loop has an associated defect preventing test signals being scanned therethrough, said combined serial scan chain not including said excluded serial scan chain permitting test signals to be communicated with those of said plurality of circuit blocks corresponding to serial scan chain loops still included within said combined serial scan chain.

10. A method as claimed in claim 8, wherein said configuration command excludes an excluded serial chain loop from said combined serial scan chain when said excluded serial scan chain loop is associated with a circuit block in said power saving state, said combined serial scan chain not including said excluded serial scan chain permitting test signals to be communicated with those of said plurality of circuit blocks corresponding to serial scan chain loops still included within said combined serial scan chain.

11. A method as claimed in claim 8, wherein at least one of said circuit blocks is a group of one or more memories including a built-in test controller.

12. A method as claimed in claim 11, wherein said test signals communicated with said group of one or more memories via said combined serial scan chain comprise one or more of:

built-in test controller commands for controlling said built-in test controller;

test pattern input data to be used by said built-in test controller; and result data indicative of test results for test performed upon said group of one or more memories by said built-in test controller.

13. A method as claimed in claim 8, wherein said test controller operates in accordance with the IEEE 1500 Standard for Embedded Core Test.

* * * * *